US009479868B2

(12) United States Patent
Ilango et al.

(10) Patent No.: US 9,479,868 B2
(45) Date of Patent: Oct. 25, 2016

(54) SYSTEMS AND METHODS FOR DETECTION OF LOAD IMPEDANCE OF A TRANSDUCER DEVICE COUPLED TO AN AUDIO DEVICE

(71) Applicant: Cirrus Logic, Inc., Austin, TX (US)

(72) Inventors: Anand Ilango, Austin, TX (US);
Daniel John Allen, Austin, TX (US);
Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 453 days.

(21) Appl. No.: 14/036,136

(22) Filed: Sep. 25, 2013

(65) Prior Publication Data

US 2015/0078559 A1 Mar. 19, 2015

Related U.S. Application Data

(60) Provisional application No. 61/878,138, filed on Sep. 16, 2013.

(51) Int. Cl.
*H04R 3/00* (2006.01)
*H04R 29/00* (2006.01)
(Continued)

(52) U.S. Cl.
CPC ........... *H04R 3/007* (2013.01); *G10K 11/1788* (2013.01); *H03F 1/0211* (2013.01); *H03F 1/0227* (2013.01); *H03F 1/52* (2013.01); *H03F 3/181* (2013.01); *H03F 3/183* (2013.01); *H03F 3/185* (2013.01); *H03F 3/52* (2013.01); *H04R 5/04* (2013.01); *H04R 29/001* (2013.01); *G10K 2210/1081* (2013.01);
(Continued)

(58) Field of Classification Search
CPC .................................................. H03F 2200/378
USPC ....... 381/58, 120, 107; 330/10, 264, 297, 57
See application file for complete search history.

(56) References Cited

U.S. PATENT DOCUMENTS 6,020,787 A 2/2000 Kim et al.
6,255,909 B1 7/2001 Muza
(Continued)

FOREIGN PATENT DOCUMENTS

EP 1118865 A1 7/2001
EP 1995872 A1 11/2008
(Continued)

OTHER PUBLICATIONS

Krzysztof Sozanski, Digital Correction Filters for Subwoofer Loudspeaker Systems with Acoustic Dipoles, Audio Engineering Society 32nd Annual Conference, Sep. 21-Sep. 23, 2007, pp. 1-7, XP040374690, Hillerrod, Denmark.
(Continued)

*Primary Examiner* — Md S Elahee
(74) *Attorney, Agent, or Firm* — Jackson Walker L.L.P.

(57) ABSTRACT

In accordance with systems and methods of the present disclosure, an audio device may include an electrical terminal, an audio circuit, and a transducer load detection circuit. The electrical terminal may couple a transducer device to the audio device. The audio circuit may generate an analog audio signal, wherein the analog audio signal is coupled to the electrical terminal The transducer load detection circuit may detect a load impedance of the transducer device when the transducer device is coupled to the audio device from characteristics measured at the electrical terminal.

15 Claims, 6 Drawing Sheets

(51) Int. Cl.
*G10K 11/178* (2006.01)
*H03F 1/02* (2006.01)
*H03F 3/181* (2006.01)
*H03F 3/52* (2006.01)
*H03F 3/185* (2006.01)
*H03F 1/52* (2006.01)
*H03F 3/183* (2006.01)
*H04R 5/04* (2006.01)

(52) U.S. Cl.
CPC ............ *G10K 2210/3045* (2013.01); *G10K 2210/3049* (2013.01); *G10K 2210/30232* (2013.01); *H03F 2200/03* (2013.01); *H03F 2200/462* (2013.01); *H03F 2200/471* (2013.01); *H04R 2420/05* (2013.01)

(56) References Cited

U.S. PATENT DOCUMENTS

| | | | |
|---|---|---|---|
| 7,579,832 B1 | 8/2009 | Blackburn et al. | |
| 7,808,324 B1 | 10/2010 | Woodford et al. | |
| 7,830,209 B1 | 11/2010 | Woodford et al. | |
| 7,912,501 B2 | 3/2011 | Johnson et al. | |
| 8,363,854 B2 * | 1/2013 | Chou | H03G 5/005 381/107 |
| 8,467,828 B2 | 6/2013 | Johnson et al. | |
| 2007/0057720 A1 | 3/2007 | Hand et al. | |
| 2007/0098190 A1 | 5/2007 | Song et al. | |
| 2008/0144861 A1 | 6/2008 | Melanson et al. | |
| 2010/0194413 A1 | 8/2010 | Dalbjoern et al. | |
| 2013/0070932 A1 | 3/2013 | Nyu et al. | |
| 2013/0343561 A1 | 12/2013 | Johnson et al. | |
| 2014/0050330 A1 | 2/2014 | Allen et al. | |
| 2015/0078558 A1 | 3/2015 | Thandri et al. | |
| 2015/0078560 A1 | 3/2015 | Ilango et al. | |

FOREIGN PATENT DOCUMENTS

| | | |
|---|---|---|
| EP | 2140807 A1 | 1/2010 |
| GB | 2465695 A | 6/2010 |
| JP | H10 327026 A | 12/1998 |
| JP | 2002151974 A | 5/2002 |
| JP | 2007033288 A | 2/2007 |
| JP | 2007037024 A | 2/2007 |
| JP | 2008294803 A | 12/2008 |
| WO | 2008026162 A2 | 3/2008 |
| WO | 2008/085929 A2 | 7/2008 |
| WO | 2011109790 A1 | 9/2011 |
| WO | 2014/028206 A1 | 2/2014 |
| WO | 2015/038257 A2 | 3/2015 |
| WO | 2015/039002 A2 | 3/2015 |

OTHER PUBLICATIONS

International Search Report and Written Opinion, International Patent Application No. PCT/US2014/055576, mailed May 18, 2015, 20 pages.

International Search Report and Written Opinion, International Patent Application No. PCT/US2014/049760, mailed Mar. 18, 2015, 23 pages.

* cited by examiner

SYSTEMS AND METHODS FOR DETECTION OF LOAD IMPEDANCE OF A TRANSDUCER DEVICE COUPLED TO AN AUDIO DEVICE

RELATED APPLICATION

The present disclosure claims priority to U.S. Provisional Patent Application Ser. No. 61/878138, filed Sep. 16, 2013, which is incorporated by reference herein in its entirety.

FIELD OF DISCLOSURE

The present disclosure relates in general to circuits for personal audio devices such as wireless telephones and media players, and more specifically, to systems and methods that detect a load impedance of a transducer device, such as a headset or speaker, coupled to an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, such as that disclosed in U.S. patent application Ser. No. 11/610,496 (the "'496 Application"), in which an indication of the signal level at the output of the circuit is used to control the power supply voltage. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode. In traditional approaches, the various thresholds are set for a worst-case scenario of the power amplifier (e.g., load impedance, process, temperature, etc.), such that in each mode, the power supply voltage is enough to provide a sufficient voltage headroom in order to prevent clipping of the output signal generated by the power amplifier. However, because a worst-case scenario is assumed in such approaches, when the worst-case scenario is not present (e.g., the load impedance differs from the worst-case load impedance), the power supply voltage provided by the charge pump power supply in some modes may be well in excess of that needed to provide sufficient voltage headroom, thus causing power inefficiency.

Therefore, it would be desirable to detect a value of a load impedance, so that the detected value may be used control a charge-pump power supply that supplies power to an audio power amplifier circuit for a consumer audio device, in which the efficiency of the audio output stage is improved.

Detecting the value of a load impedance may also provide other advantages in addition to control of a charge pump power supply.

SUMMARY

In accordance with the teachings of the present disclosure, the disadvantages and problems associated with existing approaches to driving audio output signals may be reduced or eliminated.

In accordance with embodiments of the present disclosure, a method may include generating, by an audio circuit configured to generate analog audio signals for playback to a listener of a transducer device coupled to an electrical terminal for coupling the transducer device to the audio circuit, a test analog audio signal substantially inaudible to the listener of the transducer device. The method may also include coupling a test impedance to the electrical terminal, such that when the transducer device is coupled to the electrical terminal, the load impedance is coupled to the test impedance. The method may additionally include measuring a voltage or a current associated with the test impedance in response to the test analog audio signal. The method may further include determining a value of the load impedance based on the voltage or the current.

In accordance with these and other embodiments of the present disclosure, an apparatus may include an audio circuit and a transducer load detection circuit. The audio circuit may be configured to couple to an electrical terminal for coupling a transducer device having a load impedance to the audio circuit, generate an analog audio signal for playback to a listener of the transducer device, and generate a test analog audio signal substantially inaudible to the listener of the transducer device. The transducer load detection circuit may be configured to couple a test impedance to the electrical terminal, such that when the transducer device is coupled to the electrical terminal, the load impedance is coupled to the test impedance, measure a voltage or a current associated with the test impedance in response to the test analog audio signal, and determine a value of the load impedance based on the voltage or the current.

In accordance with these and other embodiments of the present disclosure, a method may include generating, by an audio circuit configured to generate analog audio signals for playback to a listener of a transducer device having a load impedance and coupled to an electrical terminal for coupling the transducer device to the audio circuit, a test analog audio signal substantially inaudible to the listener of the transducer device. The method may also include performing a comparison of a first signal indicative of a reference current to a second signal indicative of a current delivered to the load impedance in response to the test analog audio signal to detect the load impedance. The method may further include determining a value of the load impedance based on the comparison.

In accordance with these and other embodiments of the present disclosure, an apparatus may include and audio circuit and a transducer load detection circuit. The audio circuit may be configured to couple to an electrical terminal for coupling a transducer device having a load impedance to the audio circuit, generate an analog audio signal for playback to a listener of the transducer device, and generate a test analog audio signal substantially inaudible to a listener of the transducer device. The transducer load detection circuit may be configured to perform a comparison of a first signal indicative of a reference current to a second signal indicative of a current delivered to the load impedance in response to the test analog audio signal to detect the load impedance and determine a value of the load impedance based on the comparison.

In accordance with these and other embodiments of the present disclosure, a method may include generating, by a power amplifier, an analog audio signal to an audio output as a function of a predriver signal of the power amplifier, wherein the power amplifier comprises a power supply input configured to receive a power supply voltage and the audio output is configured to couple to an electrical terminal for coupling a transducer device to the audio output. The method may also include performing a comparison of a first signal indicative of the predriver signal to a second signal indicative of the power supply voltage. The method may further include determining a value of the load impedance based on the comparison.

In accordance with these and other embodiments of the present disclosure, an apparatus may include an audio circuit and a transducer load detection circuit. The audio circuit may include a power amplifier having an audio input configured to receive a predriver signal, an audio output configured to couple to an electrical terminal for coupling a transducer device to the audio circuit and a power supply input configured to receive a power supply voltage, wherein the power amplifier is configured to generate the analog audio signal to the audio output as a function of the predriver signal. The transducer load detection circuit may be configured perform a comparison of a first signal indicative of the predriver signal to a second signal indicative of the power supply voltage and determine a value of the load impedance based on the comparison.

In accordance with these and other embodiments of the present disclosure, a method may include generating, by a power amplifier, an analog audio signal to an audio output as a function of a predriver signal of the power amplifier, wherein the power amplifier comprises a power supply input configured to receive a power supply voltage and the audio output is configured to couple to an electrical terminal for coupling a transducer device to the audio output. The method may also include performing a comparison of a first signal indicative of a current of the at least one driver device multiplied by a programmable impedance to a second signal indicative of the analog audio signal. The method may also include determining a value of the load impedance based on the comparison.

In accordance with these and other embodiments of the present disclosure, an apparatus may include an audio circuit and a transducer load detection circuit. The audio circuit may include a power amplifier having an audio input configured to receive a predriver signal, an audio output configured to couple to an electrical terminal for coupling a transducer device to the audio circuit, and a power supply input configured to receive a power supply voltage, wherein the power amplifier is configured to generate the analog audio signal to the audio output as a function of the predriver signal. The transducer load detection circuit may be configured to perform a comparison of a first signal indicative of a current of the at least one driver device multiplied by a programmable impedance to a second signal indicative of the analog audio signal, and determine a value of the load impedance based on the comparison.

In accordance with these and other embodiments of the present disclosure, a method may include providing from a charge pump power supply a power supply voltage to a power supply input of a power amplifier having an audio input configured to receive an audio input signal, and an audio output configured to generate an analog audio signal for playback at a transducer device having a load impedance and coupled to the audio output via an electrical terminal. The method may also include detecting a peak amplitude of a voltage ripple of the power supply voltage in response to a transition of the analog audio output signal. The method may additionally include detecting a peak amplitude of a change in a digital audio input signal that causes the transition of the analog audio output signal, wherein the digital audio input is input to a digital-to-analog conversion circuit coupled to the power amplifier and configured to convert a digital audio input signal into the analog audio input signal. The method may further include estimating a value of the load impedance based on the peak amplitude of the voltage ripple and the peak amplitude of the change in the digital audio input signal.

In accordance with these and other embodiments of the present disclosure, an apparatus may include a power amplifier, a charge pump power supply, a digital-to-analog conversion circuit, and a transducer load detection circuit. The power amplifier may include an audio input configured to receive an analog audio input signal, an audio output configured to generate an analog audio output signal and configured to couple to a transducer device having a load impedance, and a power supply input. The charge pump power supply may be configured to provide a power supply voltage to the power supply input of the power amplifier. The digital-to-analog conversion circuit may be coupled to the power amplifier and configured to convert a digital audio input signal into the analog audio input signal. The transducer load detection circuit may include a first measurement circuit configured to detect a peak amplitude of a voltage ripple of the power supply voltage in response to a transition of the analog audio output signal, and a second measurement circuit configured to a peak amplitude of a change in the digital audio input signal that causes the transition of the analog audio output signal, wherein the transducer load detection circuit is configured to estimate a value of the load impedance based on the peak amplitude of the voltage ripple and the peak amplitude of the change in the digital audio input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
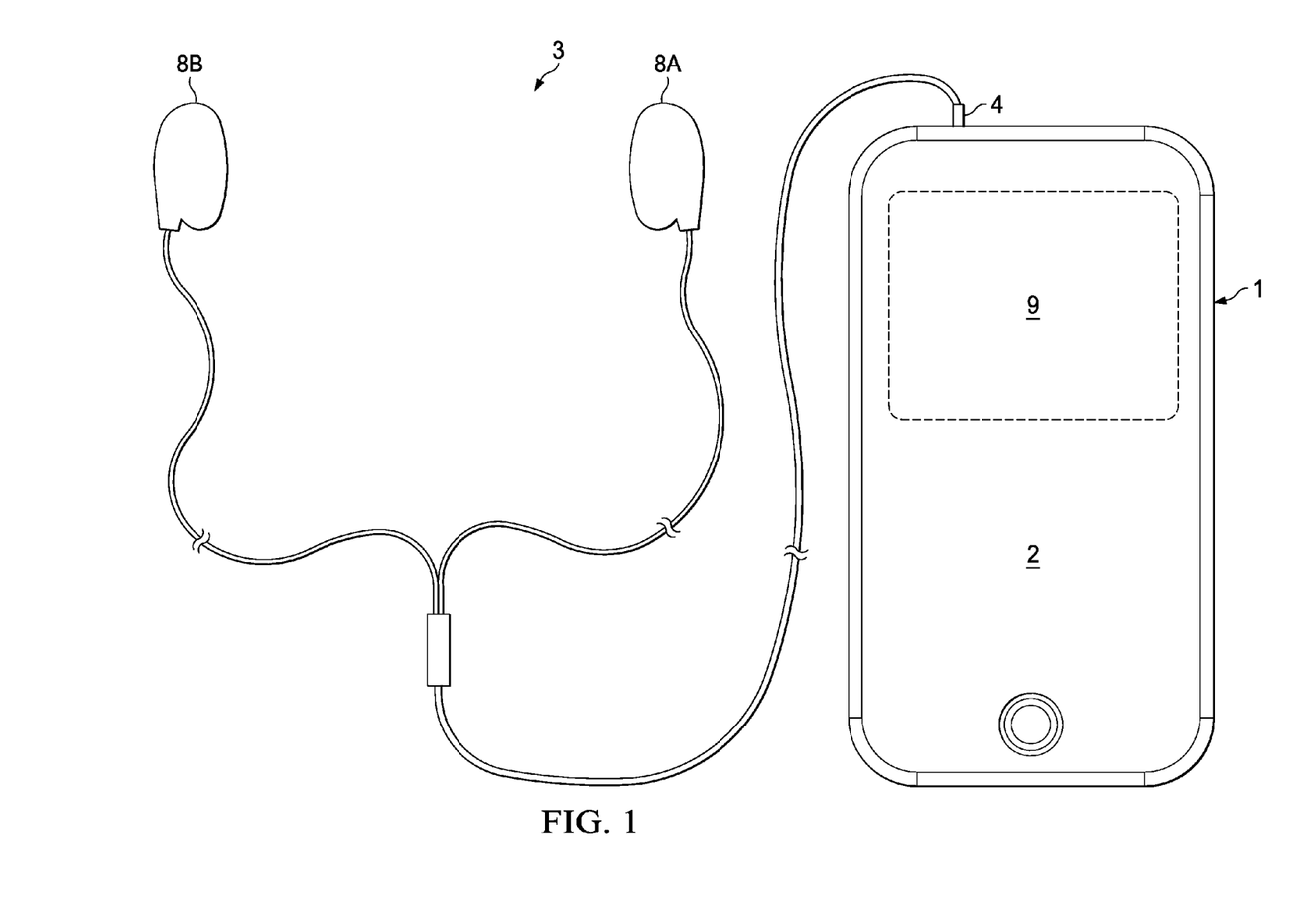
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
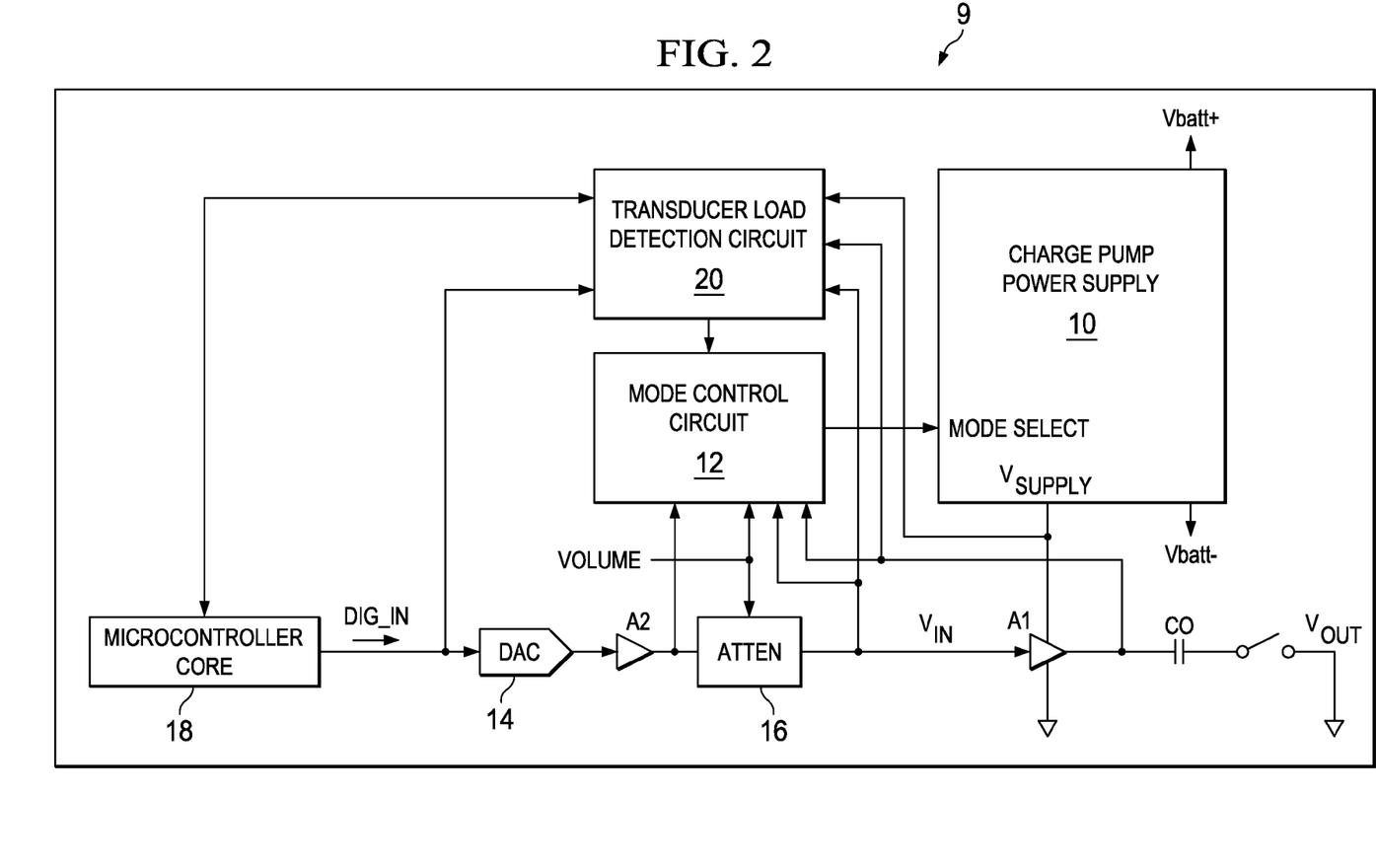
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may in turn supply an analog audio input signal to a first amplifier stage A2 that may be operated from a fixed voltage power supply. In the embodiments represented by FIG. 2, the input to DAC 14 is a digital audio source, but that is not a limitation of the present disclosure, as the techniques of the present disclosure may be applied to an audio amplifier having a purely analog signal path. The signal at the output of first amplifier stage A2 may be provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described in the '496 Application, which is incorporated by reference herein. While an attenuator 16 is shown as the volume control mechanism, it is understood that an equivalent volume control may be provided by a programmable resistor or adjustable gain in the feedback of amplifier A2 or another amplifier stage in the signal path. A final power amplifier stage A1 may amplify the audio input signal $V_{IN}$ received from attenuator 16 and provide an audio output signal $V_{OUT}$, which may operate a speaker, headphone transducer, and/or a line level signal output. A capacitor CO may be utilized to couple the output signal to the transducer or line level output, particularly if amplifier A1 is operated from a unipolar power supply having a quiescent voltage substantially differing from ground.

A charge pump power supply 10 may provide the power supply rail inputs of amplifier A1 and may receive a power supply input, generally from a battery or other power supply, depicted as battery terminal connections Vbatt+ and Vbatt−. A mode control circuit 12 may supply a Mode Select signal to charge pump power supply 10 that selects an operating mode of charge pump power supply 10 as described in greater detail in the '496 Application. Also, output voltage $V_{SUPPLY}$ of charge pump power supply 10 may be adjusted according to expected and/or actual audio signal levels at the amplifier output according to the techniques disclosed elsewhere in this disclosure and/or in the '496 Application.

When low signal levels exist and/or are expected at amplifier output $V_{OUT}$, the power efficiency of the audio output stage may be improved by varying the differential supply voltage $V_{SUPPLY}$ in conformity with the output signal $V_{OUT}$ or a signal (e.g., volume control signal Volume, audio input signal $V_{IN}$) indicative of the output signal $V_{OUT}$. In order to determine the actual and/or expected signal amplitudes at the output of amplifier A1, the volume control signal Volume, audio output signal $V_{OUT}$, and/or audio input signal $V_{IN}$ may be supplied to mode control circuit 12 for controlling the differential power supply $V_{SUPPLY}$ generated by charge pump power supply 10, in conformity with the expected amplitude of the output signal.

In operation, mode control circuit 12 may, based on a comparison of a signal level of an audio signal (e.g., a digital audio input signal received by DAC 14, analog audio input signal $V_{IN}$, audio output signal $V_{OUT}$, and/or one or more other signals in the path of the audio output signal) to one or more threshold signal levels, select a mode of operation for charge pump power supply 10, wherein a different supply voltage is generated by the charge pump power supply in each mode (e.g., supply voltage increases as the output signal level increases, and vice versa). As mentioned in the Background section, above, in traditional approaches, the various thresholds are set for a worst-case scenario of the power amplifier (e.g., load impedance, process, temperature, etc.), such that in each mode, the power supply voltage is enough to provide a sufficient voltage headroom in order to prevent clipping of the output signal generated by the power amplifier. However, in embodiments of the present disclosure, a transducer load detection circuit 20 may, based on one or more signals indicative of electrical characteristics at the audio output of audio integrated circuit 9 (e.g., a digital audio input signal received by DAC 14, an analog audio input signal $V_{IN}$, an audio output signal $V_{OUT}$, and/or one or more signals derivative thereof) determine a load impedance of a transducer device (e.g., a headset, speaker, or other transducer) when the transducer device is coupled to the audio output of the audio device. In addition or alternatively, transducer load detection circuit 20 may determine a load impedance of the transducer device when the transducer device is coupled to the audio device from measured characteristics of the digital audio input signal and the bi-polar power supply voltage. Based on the determined load impedance, transducer load detection circuit 20 may communicate a control signal to mode control circuit 12, and based on the control signal, mode control circuit 12 may set the various thresholds for switching between modes based on the control signal. Thus, mode control circuit 12 may select a mode of operation for charge pump power supply 10 based on both the output signal $V_{OUT}$ (or another signal indicative thereof) and the determined load impedance of a transducer coupled to the audio device. Transducer load detection circuit 20 may be implemented in any suitable manner, including without limitation the embodiments represented by FIGS. 3 through 7, below.

Figure 3:
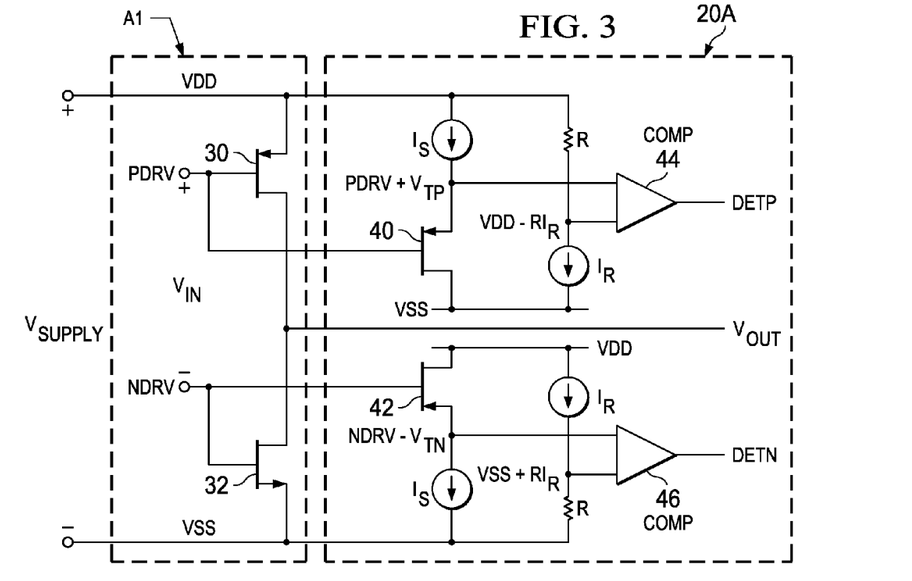
FIG. 3 is a circuit diagram of selected components of an example transducer load detection circuit, in accordance with embodiments of the present disclosure.

FIG. 3 is a circuit diagram of selected components of an example transducer load detection circuit 20A coupled to selected components of power amplifier A1, in accordance with embodiments of the present disclosure. As shown in FIG. 3, power amplifier A1 may receive differential analog audio input signal $V_{IN}$, which may include a positive polarity predriver signal PDRV received by a driver device 30 (e.g., a p-type metal-oxide-semiconductor field-effect transistor) and a negative polarity predriver signal NDRV received by a driver device 32 (e.g., an n-type metal-oxide-semiconductor field-effect transistor), wherein each driver device 30, 32 is capable of driving the output signal $V_{OUT}$ as a function of the individual predriver signals PDRV and NDRV. In addition, power amplifier A1 may receive the power supply voltage $V_{SUPPLY}$ from charge pump power supply 10 in the form of a bi-polar power supply voltage across a pair of power supply rail connections VDD and VSS of power amplifier A1.

Transducer load detection circuit 20A may comprise one or more comparison subcircuits, wherein each subcircuit compares a first signal indicative of a predriver signal (e.g., PDRV or NDRV) to a second signal indicative of a power supply voltage (e.g., VDD or VSS). For example, transducer load detection circuit 20A may include a subcircuit having a p-type metal-oxide-semiconductor field-effect transistor 40 coupled at its gate to the predriver signal PDRV, at a first non-gate terminal to supply voltage VSS, and at a second non-gate terminal to a current source having a current $I_S$, such that a voltage equal to the predriver signal PDRV plus a threshold voltage $V_{TP}$ (and thus indicative of the predriver signal PDRV) forms at the second non-gate terminal. The subcircuit may also include a resistor with resistance R coupled at a first terminal to supply voltage VDD, and coupled at a second terminal to a current source having a current $I_R$, such that a voltage equal to the supply voltage VDD minus the product $R \times I_R$ (and thus indicative of the supply voltage VDD) forms at the second terminal. In some embodiments, values of R and $I_R$ may be selected such that the voltage forming at the second terminal of the resistor is approximately equal to the supply voltage VDD (e.g., the product $R \times I_R$ may equal approximately 50 millivolts or less in some embodiments). A comparator 44 may compare the first voltage signal PDRV+$V_{TP}$ to the second voltage signal VDD−$RI_R$ to determine a load impedance (e.g., a load resistance) of a transducer coupled to output of power amplifier A1. For example, a voltage PDRV+$V_{TP}$ greater than VDD−$RI_R$ may indicate a presence of a high load impedance (e.g., greater or equal to 3 kiloohms) while a voltage PDRV+$V_{TP}$ lesser than VDD−$RI_R$ may indicate a presence of a low load impedance (e.g., lesser or equal to 200 ohms).

Additionally or alternatively, transducer load detection circuit 20A may include a subcircuit having an n-type metal-oxide-semiconductor field-effect transistor 42 coupled at its gate to the predriver signal NDRV, at a first non-gate terminal to supply voltage VDD, and at a second non-gate terminal to a current source having a current $I_S$, such that a voltage equal to the predriver signal NDRV minus a threshold voltage $V_{TN}$ (and thus indicative of the predriver signal NDRV) forms at the second non-gate terminal. The subcircuit may also include a resistor with resistance R coupled at a first terminal to supply voltage VSS, and coupled at a second terminal to a current source having a current $I_R$, such that a voltage equal to the supply voltage VSS plus the product $R \times I_R$ (and thus indicative of the supply voltage VSS) forms at the second terminal. In some embodiments, values of R and $I_R$ may be selected such that the voltage forming at the second terminal of the resistor is approximately equal to the supply voltage VSS (e.g., the product $R \times I_R$ may equal approximately 50 millivolts or less in some embodiments). A comparator 46 may compare the first voltage signal NDRV−$V_{TP}$ to the second voltage signal VSS+$RI_R$ to determine a load impedance (e.g., a load resistance) of a transducer coupled to the output of power amplifier A1. For example, a voltage NDRV−$V_{TN}$ lesser than VSS+$RI_R$ may indicate a presence of a high load impedance (e.g., greater or equal to 3 kiloohms) while a voltage NDRV−$V_{TN}$ lesser than VSS+$RI_R$ may indicate a presence of a low load impedance (e.g., lesser or equal to 200 ohms).

In some embodiments, the analog audio input signal $V_{IN}$ may be a test audio signal used by transducer load detection circuit 20A to perform its functionality, rather than an actual audio signal intended for output to a transducer. For example, a test audio signal may comprise a periodic (e.g., once every 100 milliseconds) audio signal having frequency content outside the range of human hearing (e.g., below approximately 50 hertz or above approximately 20 kilohertz) and/or having an intensity at which the test signal would be substantially imperceptible to a human listener. In these and other embodiments, such test signal may be played only when no other audio content is being played to a transducer device coupled to the output of the power amplifier.

Figure 4:
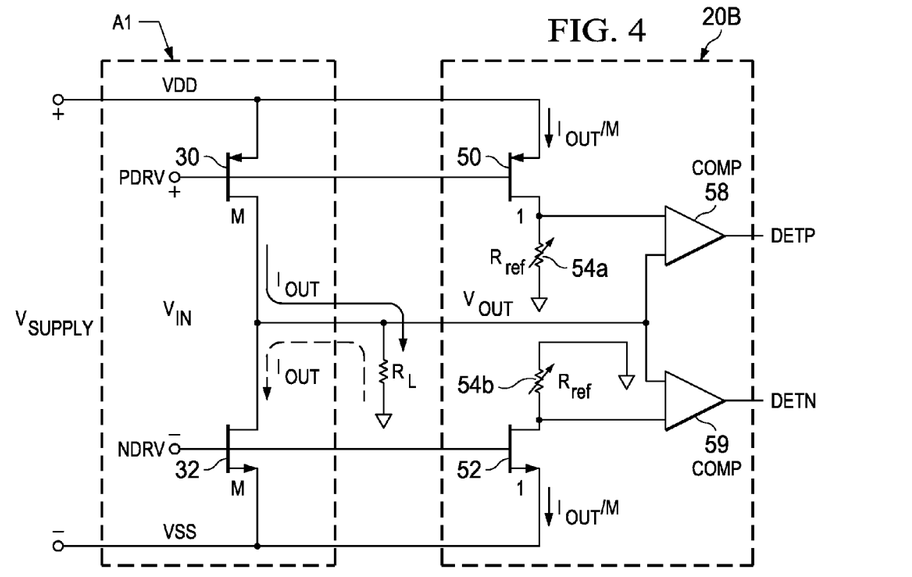
FIG. 4 is a circuit diagram of selected components of another example transducer load detection circuit, in accordance with embodiments of the present disclosure.

FIG. 4 is a circuit diagram of selected components of an example transducer load detection circuit 20B coupled to selected components of power amplifier A1, in accordance with embodiments of the present disclosure. As shown in FIG. 4, and similar to as shown in FIG. 3, power amplifier A1 may receive differential analog audio input signal $V_{IN}$, which may include a positive polarity predriver signal PDRV received by a driver device 30 (e.g., a p-type metal-oxide-semiconductor field-effect transistor) and a negative polarity predriver signal NDRV received by a driver device 32 (e.g., an n-type metal-oxide-semiconductor field-effect transistor), wherein each driver device 30, 32 is capable of driving the output signal $V_{OUT}$ as a function of the individual predriver signals PDRV and NDRV. In addition, power amplifier A1 may receive the power supply voltage $V_{SUPPLY}$ from charge pump power supply 10 in the form of a bi-polar power supply voltage across a pair of power supply rail connections VDD and VSS of power amplifier A1.

Transducer load detection circuit 20B may comprise one or more comparison subcircuits, wherein each subcircuit compares a first signal indicative of a current of the at least one driver device (e.g., driver device 30 and/or 32) multiplied by a programmable impedance to a second signal indicative of the analog audio signal (output signal $V_{OUT}$) to detect the load impedance of a transducer device coupled to the output of power amplifier A1. For example, transducer load detection circuit 20B may include a subcircuit having a p-type metal-oxide-semiconductor field-effect transistor 50 coupled at its gate to the predriver signal PDRV, at a first non-gate terminal to supply voltage VDD, and at a second non-gate terminal to a programmable resistor 54a with variable resistance $R_{ref}$. Transistor 50 and driver device 30 may have physical characteristics (e.g., size) such that a ratio of the transconductance of the driver device 30 and the transconductance of transistor 50 equals a constant M. Accordingly, transistor 50 may form a current mirror to driver device 30, such that a current $I_{OUT}/M$ may flow through transistor 50, where $I_{OUT}$ is a current flowing through driver device 30 and a load impedance of a transducer device coupled to the output of power amplifier A1 and having a resistance $R_L$. Such current through transistor 50 may cause a voltage equal to $I_{OUT}R_{ref}/M$ (and thus indicative of a current through driver device 30) to form at the second terminal of transistor 50. A comparator 58 may compare this voltage $I_{OUT}R_{ref}/M$ to the output signal $V_{OUT}$ and the resistance $R_{ref}$ of programmable resistor 54a may be varied (e.g., in accordance with a binary search) to determine the point at which the voltage $I_{OUT}R_{ref}/M$ is approximately equal the output signal $V_{OUT}$ (e.g., the approximate resistance $R_{ref}$ at which the output DETP of comparator 58 changes from one binary value to another). At this point, $I_{OUT}R_{ref}/M=V_{OUT}=I_{OUT}R_L$, meaning $R_L=R_{ref}/M$.

Additionally or alternatively, transducer load detection circuit 20B may include a subcircuit having an n-type metal-oxide-semiconductor field-effect transistor 52 coupled at its gate to the predriver signal NDRV, at a first non-gate terminal to supply voltage VSS, and at a second non-gate terminal to a programmable resistor 54b with variable resistance $R_{ref}$. Transistor 52 and driver device 32 may have physical characteristics (e.g., size) such that a ratio of the transconductance of the driver device 32 and the transconductance of transistor 52 equals a constant M. Accordingly, transistor 52 may form a current minor to driver device 32, such that a current $I_{OUT}/M$ may flow through transistor 52, where $V_{OUT}$ is a current flowing through driver device 32 and a load impedance of a transducer device coupled to the output of power amplifier A1 and having a resistance $R_L$. Such current through transistor 52 may cause a voltage equal to $I_{OUT}R_{ref}/M$ (and thus indicative of a current through driver device 32) to form at the second terminal of transistor 52. A comparator 59 may compare this voltage $I_{OUT}R_{ref}/M$ to the output signal $V T_{OUT}$ and the resistance $R_{ref}$ of programmable resistor 54b may be varied (e.g., in accordance with a binary search) to determine the point at which the voltage $I_{OUT}R_{ref}/M$ is approximately equal the output signal $VT_{OUT}$ (e.g., the approximate resistance $_{Rref}$ at which the output DETN of comparator 59 changes from one binary value to another). At this point, $I_{OUT}R_{ref}/M=V_{OUT}=I_{OUT}R_L$, meaning $R_L=R_{ref}/M$.

In some embodiments, the analog audio input signal $V_{IN}$ may be a test audio signal used by transducer load detection circuit 20B to perform its functionality, rather than an actual audio signal intended for output to a transducer. For example, a test audio signal may comprise a periodic (e.g., once every 100 milliseconds) audio signal having frequency content outside the range of human hearing (e.g., below approximately 50 hertz or above approximately 20 kilohertz) and/or having an intensity at which the test signal would be substantially imperceptible to a human listener. In these and other embodiments, such test signal may be played only when no other audio content is being played to a transducer device coupled to the output of the power amplifier.

Figure 5:
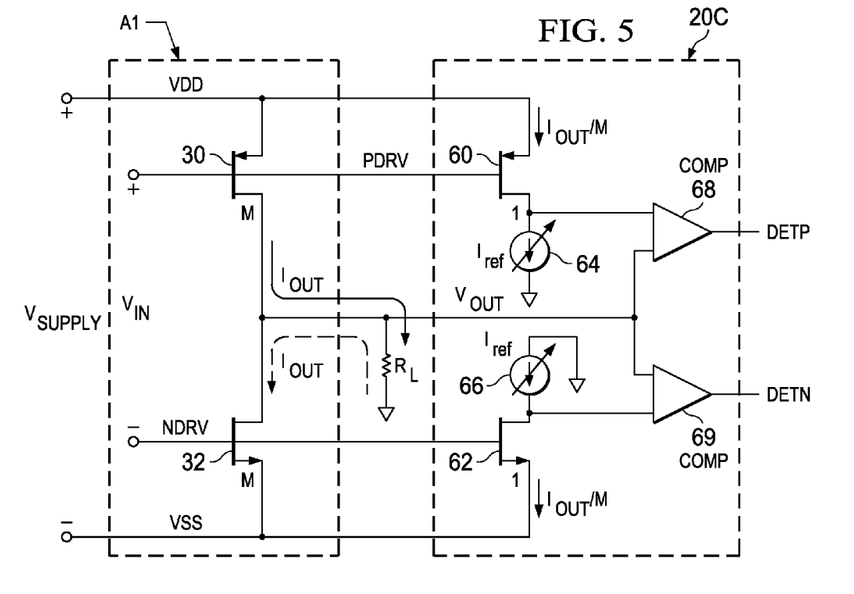
FIG. 5 is a circuit diagram of selected components of another example transducer load detection circuit, in accordance with embodiments of the present disclosure.

FIG. 5 is a circuit diagram of selected components of an example transducer load detection circuit 20C coupled to selected components of power amplifier A1, in accordance with embodiments of the present disclosure. As shown in FIG. 5, and similar to as shown in FIGS. 3 and 4, power amplifier A1 may receive differential analog audio input signal $V_{IN}$, which may include a positive polarity predriver signal PDRV received by a driver device 30 (e.g., a p-type metal-oxide-semiconductor field-effect transistor) and a negative polarity predriver signal NDRV received by a driver device 32 (e.g., an n-type metal-oxide-semiconductor field-effect transistor), wherein each driver device 30, 32 is capable of driving the output signal $V_{OUT}$ as a function of the individual predriver signals PDRV and NDRV. In addition, power amplifier A1 may receive the power supply voltage $V_{SUPPLY}$ from charge pump power supply 10 in the form of a bi-polar power supply voltage across a pair of power supply rail connections VDD and VSS of power amplifier A1.

Transducer load detection circuit 20C may comprise one or more comparison subcircuits, wherein each subcircuit compares a first signal indicative of a reference current to a second signal indicative of a current delivered to the load impedance to detect the load impedance of a transducer device coupled to the output of power amplifier A1. For example, transducer load detection circuit 20C may include a subcircuit having a p-type metal-oxide-semiconductor field-effect transistor 60 coupled at its gate to the predriver signal PDRV, at a first non-gate terminal to supply voltage VDD, and at a second non-gate terminal to a current source 64 with a programmable current $I_{ref}$. Transistor 60 and driver device 30 may have physical characteristics (e.g., size) such that a ratio of the transconductance of the driver device 30 and the transconductance of transistor 60 equals a constant M. Accordingly, transistor 60 may form a current mirror to driver device 30, such that current through transistor 60 equals $I_{OUT}/M$, where $I_{OUT}$ is a current flowing through driver device 30 and a load impedance of a transducer device coupled to the output of power amplifier A1 and having a resistance $R_L$. A comparator 68 may compare the current $I_{ref}$ to the current $I_{OUT}$ and the current $I_{ref}$ of current source 64 may be varied (e.g., in accordance with a binary search) to determine the point at which the current $I_{OUT}$ is approximately equal the programmable current $I_{ref}$ (e.g., the approximate current $I_{ref}$ at which the output DETP of comparator 68 changes from one binary value to another). At this point, $I_{OUT}/M=I_{ref}=I_{OUT}R_L$, meaning $R_L=V_{OUT}/I_{OUT}=V_{OUT}/MI_{ref}$.

In addition or alternatively, transducer load detection circuit 20C may include a subcircuit having an n-type metal-oxide-semiconductor field-effect transistor 62 coupled at its gate to the predriver signal NDRV, at a first non-gate terminal to supply voltage VSS, and at a second non-gate terminal to a current source 66 with a programmable current $I_{ref}$. Transistor 62 and driver device 32 may have physical characteristics (e.g., size) such that a ratio of the transconductance of the driver device 30 and the transconductance of transistor 62 equals a constant M. Accordingly, transistor 62 may form a current mirror to driver device 30, such that current through transistor 62 equals $I_{OUT}/M$, where $I_{OUT}$ is a current flowing through driver device 32 and a load impedance of a transducer device coupled to the output of power amplifier A1 and having a resistance $R_L$. A comparator 69 may compare the current $I_{ref}$ to the current $I_{OUT}$ and the current $I_{ref}$ of current source 66 may be varied (e.g., in accordance with a binary search) to determine the point at which the current $I_{OUT}$ is approximately equal the programmable current $I_{ref}$ (e.g., the approximate current $I_{ref}$ at which the output DETN of comparator 69 changes from one binary value to another). At this point, $I_{OUT}/M=I_{ref}=I_{OUT}R_L$, meaning $R_L=V_{OUT}/I_{OUT}=V_{OUT}/MI_{ref}$.

In some embodiments, the analog audio input signal $V_{IN}$ may be a test audio signal used by transducer load detection circuit 20C to perform its functionality, rather than an actual audio signal intended for output to a transducer. For example, a test audio signal may comprise a periodic (e.g., once every 100 milliseconds) audio signal having frequency content outside the range of human hearing (e.g., below approximately 50 hertz or above approximately 20 kilohertz) and/or having an intensity at which the test signal would be substantially imperceptible to a human listener. In these and other embodiments, such test signal may be played only when no other audio content is being played to a transducer device coupled to the output of the power amplifier.

Based on the load impedance detected by any of transducer detection circuits 20A-20C, operating parameters of audio IC 9 may be optimized. As mentioned above, mode control circuit 12 may select a mode of operation for charge pump power supply 10 based on the load impedance detected by transducer load detection circuits 20A-C (e.g., by varying threshold levels of output signal $V_{OUT}$ for which charge pump power supply 10 may transition between operating modes). As another example, operating parameters of power amplifier A1 may be optimized based on the load impedance detected by transducer load detection circuits 20A-C. For instance, in some embodiments, power amplifier A1 may include a variable compensation capacitor whose capacitance may vary in order to stabilize amplifier in feedback for a wide range of load impedances. In such embodiments, control circuitry for controlling the capacitance compensation capacitor may set the capacitance based on the load impedance detected by transducer load detection circuits 20A-C in order to improve performance of power amplifier A1. In these and other embodiments, power amplifier A1 may have a quiescent power profile. The quiescent power profile may maintain a quiescent current in amplifier A1 in order to maintain stability of A1 with a give range of load impedances. If a load impedance is known, the quiescent current may be optimized for that particular load value, which may result in power savings. Accordingly, control circuitry for controlling the quiescent power profile may do so based on the load impedance determined by transducer load detection circuits 20A-C.

Figure 6:
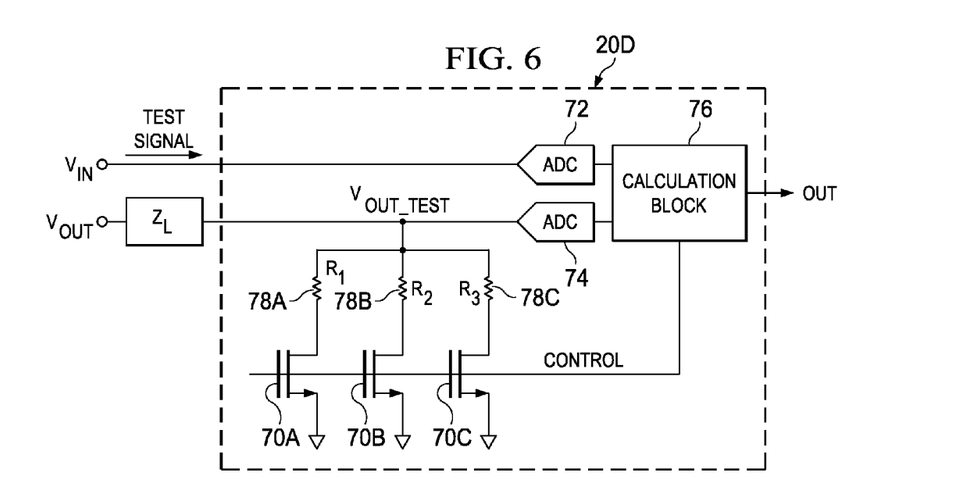
FIG. 6 is a block diagram of selected components of another example transducer load detection circuit, in accordance with embodiments of the present disclosure.

FIG. 6 is a block diagram of selected components of an example transducer load detection circuit 20D, in accordance with embodiments of the present disclosure. In operation, transducer load detection circuit 20D may couple at least one test impedance (e.g., at least one of resistors 78A, 78B, and 78C) to a terminal of the load impedance (having an impedance $Z_L$) of the transducer device opposite the terminal coupled to the output signal $V_{OUT}$, thus forming a voltage divider of the output voltage $V_{OUT}$ between the load impedance and the test impedance. Transducer load detection circuit 20D may, responsive to a test analog signal generated by audio integrated circuit 9, measure a voltage or current associated with the test impedance in response to the test analog audio signal to detect the load impedance $Z_L$. In other embodiments, the transducer load detection circuit may sequentially couple (e.g., via transistors 70A, 70B, 70C, or other suitable switches), a plurality of test impedances (e.g., resistors 78A, 78B, and 78C) each with different impedance values (e.g., $R_1$, $R_2$, $R_3$, respectively), and one or more additional test impedances to the electrical terminal to a terminal of the load impedance of the transducer device opposite the terminal coupled to the output signal $V_{OUT}$, thus forming a voltage divider of the output voltage $V_{OUT}$ between the load impedance and the various test impedances as such impedances are sequentially coupled to the load impedance. For each test impedance, transducer load detection circuit 20D may, responsive to a test analog signal generated by audio integrated circuit 9, measure a voltage or current associated with each test impedance in response to the test analog audio signal to detect the load impedance $Z_L$.

To illustrate, for each test impedance, a test signal may be applied to the analog audio input signal $V_{IN}$, which may be converted to a digital signal by an analog-to-digital converter (ADC) 72. Similarly, the output signal $V_{OUT}$ generated in response to the test signal on $V_{IN}$ may be divided between the load impedance of the transducer device and the test resistance to generate a voltage $V_{OUT\_TEST}$, which may also be converted to a digital signal by an ADC 74. A calculation block 76 may apply mathematics to the digital versions of $V_{IN}$ and $V_{OUT\_TEST}$ to generate an indication of the load impedance, including resistive, capacitive, and inductive components of the load resistance. Calculation block 76 or another component of transducer load detection circuit 20D may also apply a control signal to transistors 70A, 70B, and 70C to control which test impedance is coupled to the load impedance.

As an example of the calculation of the load impedance, the load impedance $Z_L$ may be modeled as a capacitor with capacitance $C_L$ in parallel with a series combination of a resistor with resistance $R_L$ and an inductor with inductance $L_L$. For sufficiently low values of capacitance (e.g., $C_L \leq 2$ nanofarads) and resistance (e.g., $R_L \leq 1$ kiloohm), resistance may be estimated by the equation:

$$R_L = R_T (1/M\sqrt{(1+\tan^2\Theta)}-1)$$

and may, for sufficiently small values of inductance LL be estimated by the equation:

$$R_L = R_T(1/M-1)$$

and inductance may be estimated by the equation:

$$L_L = -(R_T \tan \Theta)/(2\pi f/M\sqrt{(1+\tan^2 \Theta)})$$

where $R_T$ is the test resistance, $M=|V_{IN}/V_{OUT\_TEST}|$, $\Theta=$ the difference between $V_{IN}$ and $V_{OUT\_TEST}$, and f is the frequency of the signal $V_{IN}$.

For sufficiently high values of capacitance (e.g., $C_L \geq 2$ nanofarads) and resistance (e.g., $R_L \geq 3$ kiloohm), capacitance may be estimated by the equations:

$$C_L \geq (1/2\pi f R_T)\sqrt{(m^2/(1-m^2))} \text{ [for } R_L >> R_T\text{]}$$

$$C_L \geq (1/2\pi f R_T)\sqrt{(4m^2/(1-m^2))} \text{ [for } R_L = R_T\text{]}$$

Based on the complex impedance detected using the technique described with respect to FIG. 6, transducer detection circuit 20D and/or another component of audio IC 9 may identify a type of transducer (e.g., a type of head set) coupled to audio IC 9 and the identity of the type of transducer may be used to optimize performance of audio IC 9 and/or the transducer or permit a manufacturer of an audio device including transducer detection circuit 20D to offer features associated with certain types of transducers. For example, based on detecting a relatively high resistance and a relatively low capacitance, transducer detection circuit 20D and/or another component of audio IC 9 may infer that an open load is coupled to a plug 4 of a personal audio deivce 1. As another example, based on detecting a relatively high resistance and a relatively high capacitance, transducer detection circuit 20D and/or another component of audio IC 9 may infer that a line load is coupled to a plug 4 of a personal audio deivce 1. As a further example, based on detecting a relatively low resistance, transducer detection circuit 20D and/or another component of audio IC 9 may infer that a head set is coupled to a plug 4 of a personal audio device 1, and may in some embodiments determine an estimated resistance value from which a type of head set may be identified.

In addition, operating parameters of audio IC 9 may be optimized based on the impedance detected by transducer detection circuit 20D. As mentioned above, mode control circuit 12 may select a mode of operation for charge pump power supply 10 based on the load impedance detected by transducer load detection circuit 20D (e.g., by varying threshold levels of output signal $V_{OUT}$ for which charge pump power supply 10 may transition between operating modes). As another example, operating parameters of power amplifier A1 may be optimized based on the load impedance detected by transducer load detection circuit 20D. For instance, in some embodiments, power amplifier A1 may include a variable compensation capacitor whose capacitance may vary in order to stabilize amplifier in feedback for a wide range of load impedances. In such embodiments, control circuitry for controlling the capacitance compensation capacitor may set the capacitance based on the load impedance detected by transducer load detection circuit 20D in order to improve performance of power amplifier A1. In these and other embodiments, power amplifier A1 may have a quiescent power profile. The quiescent power profile may maintain a quiescent current in amplifier A1 in order to maintain stability of A1 with a give range of load impedances. If a load impedance is known, the quiescent current may be optimized for that particular load value, which may result in power savings. Accordingly, control circuitry for controlling the quiescent power profile may do so based on the load impedance determined by transducer load detection circuit 20D.

As mentioned above, mode control circuit 12 may select a mode of operation for charge pump power supply 10 based on the load impedance detected by transducer load detection circuit 20D (e.g., by varying threshold levels of output signal $V_{OUT}$ for which charge pump power supply 10 may transition between operating modes). As another example, operating parameters of power amplifier A1 may be optimized based on the load impedance detected by transducer load detection circuit 20D. For example, power amplifier A1 may include a variable compensation capacitor, and a capacitance of the variable compensation capacitor may be set based on the load impedance in order to improve performance of power amplifier A1. As another example, a quiescent power profile of the power amplifier may be modified based on the load impedance in order to optimize quiescent power and reduce idle power consumption.

As mentioned above, a test analog signal may be applied to analog audio input signal $V_{IN}$ to allow transducer load detection circuit 20D to perform its functionality, rather than an actual audio signal intended for output to a transducer. For example, a test audio signal may comprise an audio signal having frequency content outside the range of human hearing (e.g., below approximately 50 hertz or above approximately 20 kilohertz) and/or having an intensity at which the test signal would be substantially imperceptible to a human listener. In these and other embodiments, such test signal may be played only when no other audio content is being played to a transducer device coupled to the output of the power amplifier.

Figure 7:
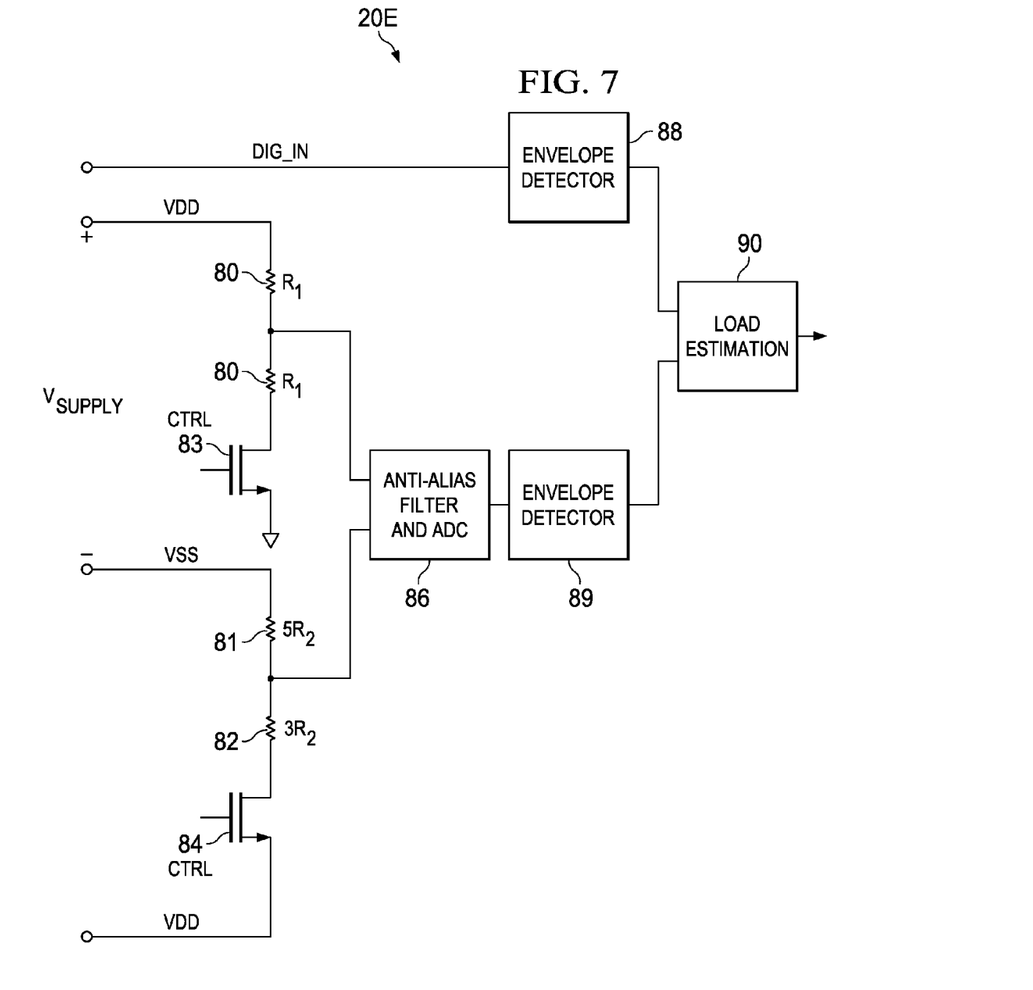
FIG. 7 is a block diagram of selected components of another example transducer load detection circuit, in accordance with embodiments of the present disclosure.

FIG. 7 is a block diagram of selected components of an example transducer load detection circuit 20E, in accordance with embodiments of the present disclosure. In operation, example transducer load detection circuit 20E may determine a load impedance of the transducer device when the transducer device is coupled to the audio device from measured characteristics of the digital audio input signal DIG_IN received by DAC 14 and the bi-polar power supply voltage generated by charge pump power supply 10. The example transducer load detection circuit 20E may include a first measurement subcircuit for determining a peak amplitude of a voltage ripple of the bi-polar power supply voltage in response to a transition of the analog audio output signal $V_{OUT}$. Such measurement subcircuit may include a voltage divider of supply voltage VDD formed by two resistors 80 and include a voltage divider of supply voltage VSS formed by two resistors 81 and 82. Such voltage dividers may be selectively enabled by transistors 83, 84 or other switches, so that when example transducer load detection circuit 20E is inactive, the supply voltages VDD and VSS are not loaded with resistors 80, 81, and 82. The voltage divided supply voltages may be received by an anti-alias filter and ADC 86 to convert the analog divided supply voltages into their digital counterpart. An envelope detector 89 may detect the peak ripple of the bi-polar power supply voltage in response to a transition of the analog audio output signal $V_{OUT}$, and communicate a signal indicative of such peak ripple to load estimation block 90.

Example transducer load detection circuit 20E may also include a second measurement subcircuit for determining a peak amplitude of a change in digital audio input signal DIG_IN that causes the transition of the analog audio output signal $V_{OUT}$. Such subcircuit may include an envelope detector 88 that receives the digital audio input signal DIG_IN, detects the peak amplitude of a change in digital audio input signal DIG_IN that causes the transition of the analog audio output signal $V_{OUT}$, and communicates a signal indicative of such peak amplitude to load estimation block 90.

Load estimation block 90 may estimate the load impedance based on the peak amplitude of the voltage ripple and the peak amplitude of change in digital audio input signal DIG_IN. For example, the peak amplitude $V_{pk}$ of the change in digital audio input signal DIG_IN and the peak amplitude of the voltage ripple $V_{ripple}$ may be related by the equation $V_{ripple}=V_{pk}R_{switch}/R_L$, where $R_{switch}$ is an input series resistance associated with charge pump power supply 10. Thus, if $V_{ripple}$ and $V_{pk}$ are estimated, and $R_{switch}$ is known, load estimation block 90 may solve for the load impedance $R_L$. In some embodiments, values for $V_{pk}$ and $V_{ripple}$ may be measured and averaged over multiple cycles of peaks of VDD and VSS in determining load resistance $R_L$.

Figure 8:
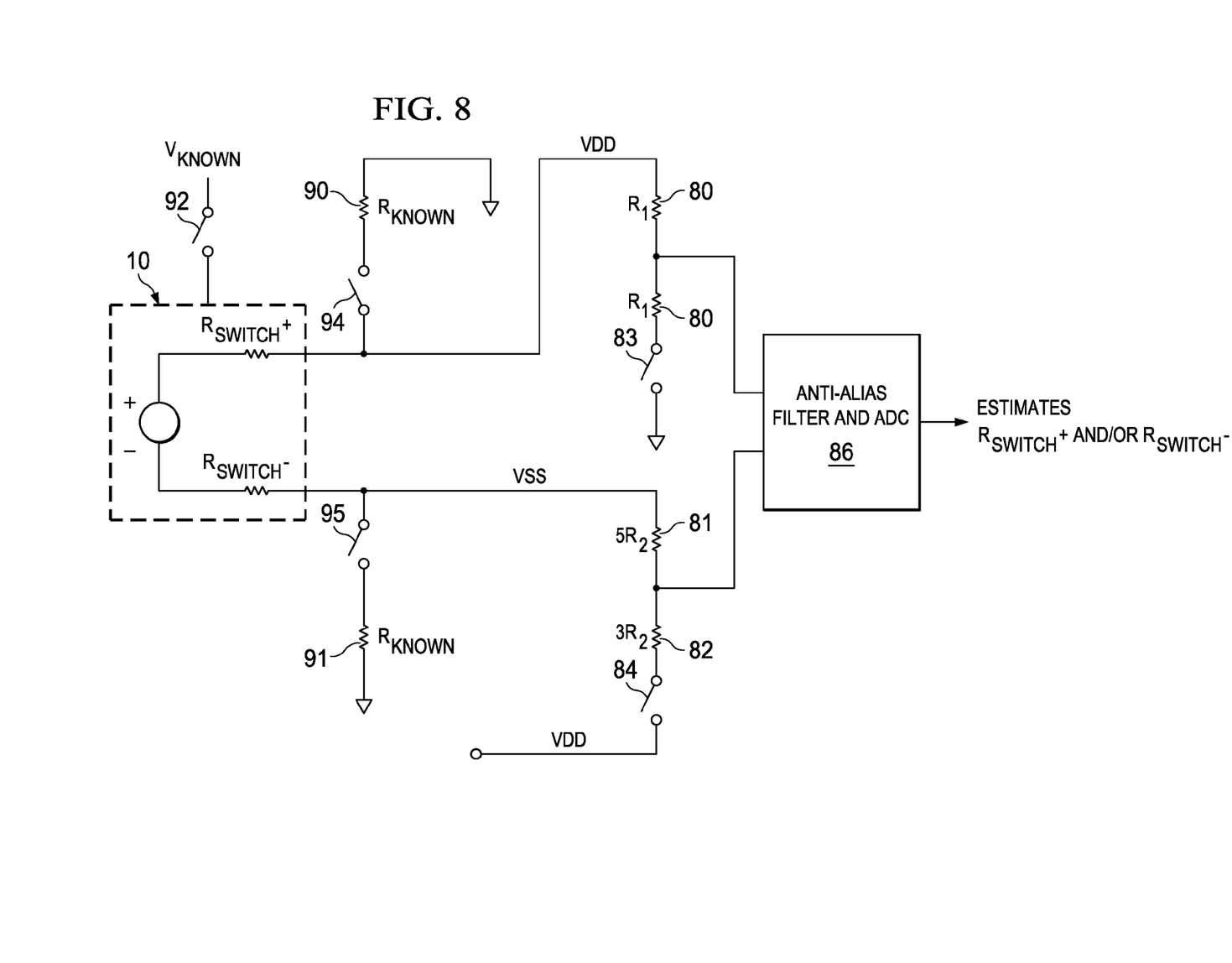
FIG. 8 is a block diagram of selected components for calibrating resistances in the transducer load detection circuit depicted in FIG. 7, in accordance with embodiments of the present disclosure.

FIG. 8 is a block diagram of selected components for calibrating the input series resistance $R_{switch}$, in accordance with embodiments of the present disclosure. As shown in FIG. 8, at power-up of transducer load detection circuit 20E, a known voltage $V_{KNOWN}$ may be applied to charge pump power supply 10 (e.g., in lieu of Vbatt+ and Vbatt−) via switch 92, which may be closed during such calibration and open otherwise. During such calibration, a resistor 90 known resistance $R_{KNOWN}$ may be coupled between VDD and a ground voltage such that when switch 94 is closed during the start-up calibration stage (and switch 83 is also closed during such start-up calibration stage) resistor 90 is in parallel with a first voltage divider comprising resistors 80 each having resistance $R_1$. In addition, during such calibration, a resistor 91 known resistance $R_{KNOWN}$ may be coupled between VSS and a ground voltage such that when switch 95 is closed during the start-up calibration stage (and switch 84 is also closed during such start-up calibration stage), resistor 91 is in parallel with a second voltage divider comprising resistors 81 and 82 each having resistances $5R_2$ and $3R_2$, respectively. The outputs of the first voltage divider and second voltage divider may be communicated to anti-alias filter and ADC 86, which may estimate input resistances $R_{switch}+$ and $R_{switch}-$ of the positive polarity and negative polarity, respectively, of charge pump power supply 10 in accordance with mathematical principles of the various resistances depicted in FIG. 8. In some embodiments, the resistances $R_{switch}+$ and $R_{switch}-$ may be estimated for each mode of operation of charge pump power supply 10. One advantage of the technique disclosed in FIGS. 7 and 8 is that the technique provides a real-time detection of a load impedance $R_L$ of a transducer device, without affecting a playback path of an audio signal communicated to the transducer device.

Based on the load impedance detected by any of transducer detection circuit 20A-20E, operating parameters of audio IC 9 may be optimized. As mentioned above, mode control circuit 12 may select a mode of operation for charge pump power supply 10 based on the load impedance detected by transducer load detection circuit 20E (e.g., by varying threshold levels of output signal $V_{OUT}$ for which charge pump power supply 10 may transition between operating modes). As another example, operating parameters of power amplifier A1 may be optimized based on the load impedance detected by transducer load detection circuit 20E. For instance, in some embodiments, power amplifier A1 may include a variable compensation capacitor whose capacitance may vary in order to stabilize amplifier in feedback for a wide range of load impedances. In such embodiments, control circuitry for controlling the capacitance compensation capacitor may set the capacitance based on the load impedance detected by transducer load detection circuit 20E in order to improve performance of power amplifier A1. In these and other embodiments, power amplifier A1 may have a quiescent power profile. The quiescent power profile may maintain a quiescent current in amplifier A1 in order to maintain stability of A1 with a give range of load impedances. If a load impedance is known, the quiescent current may be optimized for that particular load value, which may result in power savings. Accordingly, control circuitry for controlling the quiescent power profile may do so based on the load impedance determined by transducer load detection circuit 20E.

Throughout portions of this disclosure, charge pump power supply 10 is shown as providing a differential bi-polar power supply to amplifier A1. However, as used in this description and in the claims, the term "power supply" and "power supply voltage" may generally refer to a single-ended power supply (e.g., referenced to a ground voltage) and a differential power supply (e.g., a bi-polar power supply).

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method comprising:
    generating, by an audio circuit configured to generate analog audio signals for playback to a listener of a transducer device having a load impedance and coupled to an electrical terminal for coupling the transducer device to the audio circuit, a test analog audio signal substantially inaudible to the listener of the transducer device;
    performing a comparison of a first signal indicative of a reference current to a second signal indicative of a current delivered to the load impedance in response to the test analog audio signal to detect the load impedance;
    determining a value of the load impedance based on the comparison; and
    setting a capacitance of a variable compensation capacitor based on the load impedance, wherein the audio circuit further comprises a power amplifier having an audio input for receiving an audio input signal, an audio output for providing the analog audio signal, and the variable compensation capacitor.

2. The method of claim 1, further comprising:
    sequentially modifying the reference current among a plurality of current values;
    for each of the plurality of current values, performing a comparison of a first signal indicative of the reference current to a second signal indicative of a current delivered to the load impedance in response to the test analog audio signal; and
    determining the value of the load impedance based on at least one of the comparisons.

3. The method of claim 1, wherein the test analog audio signal comprises frequency content outside of the range of human hearing.

4. The method of claim 3, wherein the test analog audio signal comprises only frequency content greater than approximately 20 kilohertz or frequency content lesser than approximately 50 hertz.

5. The method of claim 1, wherein the audio circuit further comprises:
    providing from a charge pump power supply a power supply voltage to a power supply input of a power amplifier having an audio input configured to receive an audio input signal, and an audio output configured to generate the analog audio signal, wherein the charge pump power supply has a select input for selecting an operating mode of the power supply, such that in a first operating mode, the power supply voltage is equal to a first voltage, and such that in a second operating mode the power supply voltage is equal to a fraction of the first voltage; and
    selecting the operating mode of the charge pump power supply based on the load impedance.

6. The method of claim 1, wherein:
the audio circuit further comprises a power amplifier having an audio input for receiving an audio input signal, and an audio output for providing the analog audio signal;
the method further comprises configuring a quiescent power profile of the power amplifier based on the load impedance.

7. The method of claim 1, wherein the transducer device is a head set and the load impedance is indicative of a type of head set coupled to the electrical terminal.

8. An apparatus comprising:
an audio circuit configured to:
couple to an electrical terminal for coupling a transducer device having a load impedance to the audio circuit:
generate an analog audio signal for playback to a listener of the transducer device; and
generate a test analog audio signal substantially inaudible to a listener of the transducer device; wherein the audio circuit comprises a power amplifier having an audio input for receiving an audio input signal, an audio output for providing the analog audio signal, and a variable compensation capacitor, and a capacitance of the variable compensation capacitor is set based on the load impedance; and
a transducer load detection circuit configured to:
perform a comparison of a first signal indicative of a reference current to a second signal indicative of a current delivered to the load impedance in response to the test analog audio signal to detect the load impedance; and
determine a value of the load impedance based on the comparison.

9. The apparatus of claim 8, wherein the transducer load detection circuit is further configured to:
sequentially modify the reference current among a plurality of current values;
for each of the plurality of current values, perform a comparison of a first signal indicative of the reference current to a second signal indicative of a current delivered to the load impedance in response to the test analog audio signal; and
determine the value of the load impedance based on at least one of the comparisons.

10. The apparatus of claim 8, wherein the test analog audio signal comprises frequency content outside of the range of human hearing.

11. The apparatus of claim 10, wherein the test analog audio signal comprises only frequency content greater than approximately 20 kilohertz or frequency content lesser than approximately 50 hertz.

12. The apparatus of claim 8, wherein the audio circuit further comprises:
a power amplifier having an audio input configured to receive an audio input signal, an audio output configured to generate the analog audio signal, and a power supply input;
a charge pump power supply configured to provide a power supply voltage to the power supply input, wherein the charge pump power supply has a select input for selecting an operating mode of the power supply, such that in a first operating mode, the power supply voltage is equal to a first voltage, and such that in a second operating mode the power supply voltage is equal to a fraction of the first voltage; and
a control circuit configured to select the operating mode of the charge pump power supply based on the value of the load impedance.

13. The apparatus of claim 8, wherein the audio circuit further comprises a power amplifier having an audio input for receiving an audio input signal, and an audio output for providing the analog audio signal, and wherein a quiescent power profile of the power amplifier is based on the load impedance.

14. The apparatus of claim 8, wherein the transducer device is a head set and the load impedance is indicative of a type of head set coupled to the electrical terminal.

15. The apparatus of claim 8, further comprising the electrical terminal, and wherein the apparatus is a personal audio device.

* * * * *